(12) United States Patent
Tanaka et al.

(10) Patent No.: US 6,180,293 B1
(45) Date of Patent: Jan. 30, 2001

(54) MASK PATTERN PREPARING METHOD AND PHOTOMASK

(75) Inventors: Satoshi Tanaka, Kawasaki; Toshiya Kotani, Sagamihara; Soichi Inoue, Yokohama, all of (JP)

(73) Assignee: Kabushiki Kaisha Toshiba, Kawasaki (JP)

(*) Notice: Under 35 U.S.C. 154(b), the term of this patent shall be extended for 0 days.

(21) Appl. No.: 09/340,148

(22) Filed: Jun. 28, 1999

(30) Foreign Application Priority Data

Jun. 29, 1998 (JP) .................................................. 10-182431

(51) Int. Cl.⁷ ........................................................ G03F 9/00
(52) U.S. Cl. .................................................. 430/5; 430/30
(58) Field of Search ............................................. 430/5, 30

(56) References Cited

U.S. PATENT DOCUMENTS

| | | | |
|---|---|---|---|
| 5,792,581 | * 8/1998 | Ohnumn | 430/30 |
| 5,821,014 | * 10/1998 | Chen et al. | 430/30 |
| 5,994,009 | * 11/1999 | Tzu et al. | 430/30 |
| 6,051,347 | * 4/2000 | Tzu et al. | 430/30 |

FOREIGN PATENT DOCUMENTS 10-10701   1/1998   (JP) .

OTHER PUBLICATIONS

John P. Stirniman et al., "Spatial filter models to describe IC lithographic behavior," SPIE vol. 3051, pp. 469–478, (1998).

* cited by examiner

*Primary Examiner*—Christopher G. Young
(74) *Attorney, Agent, or Firm*—Finnegan, Henderson, Farabow, Garrett, & Dunner, L.L.P.

(57) ABSTRACT

A method for preparing a mask pattern used for forming a desired pattern on a substrate to be exposed comprises the steps of effecting correction on design data in connection with a first element to be corrected, the first element allowing a correction amount to be determined depending upon a pattern contained in an area of a predetermined size, converting the corrected design data to mask writing data, and when write processing is done with a writing device in which mask writing data is incorporated, effecting correction in connection with a second element to be corrected which excludes the first element.

6 Claims, 5 Drawing Sheets

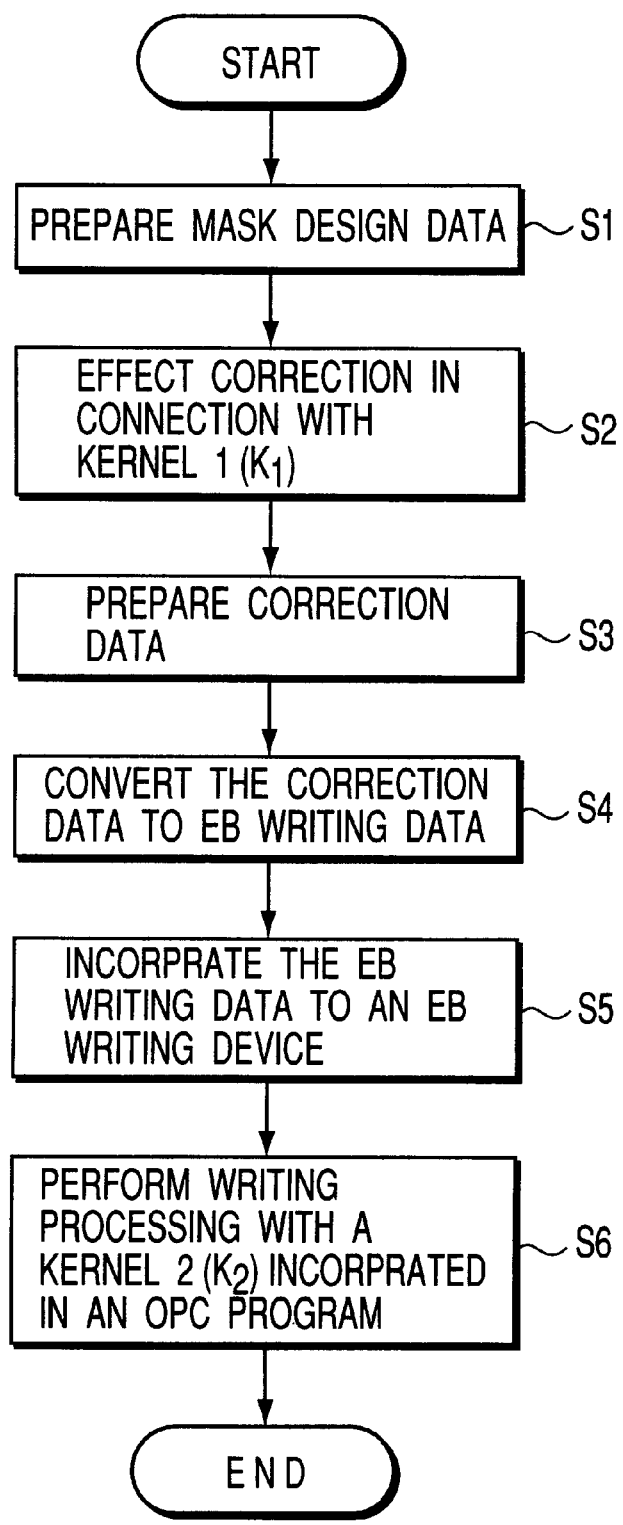
F I G. 1

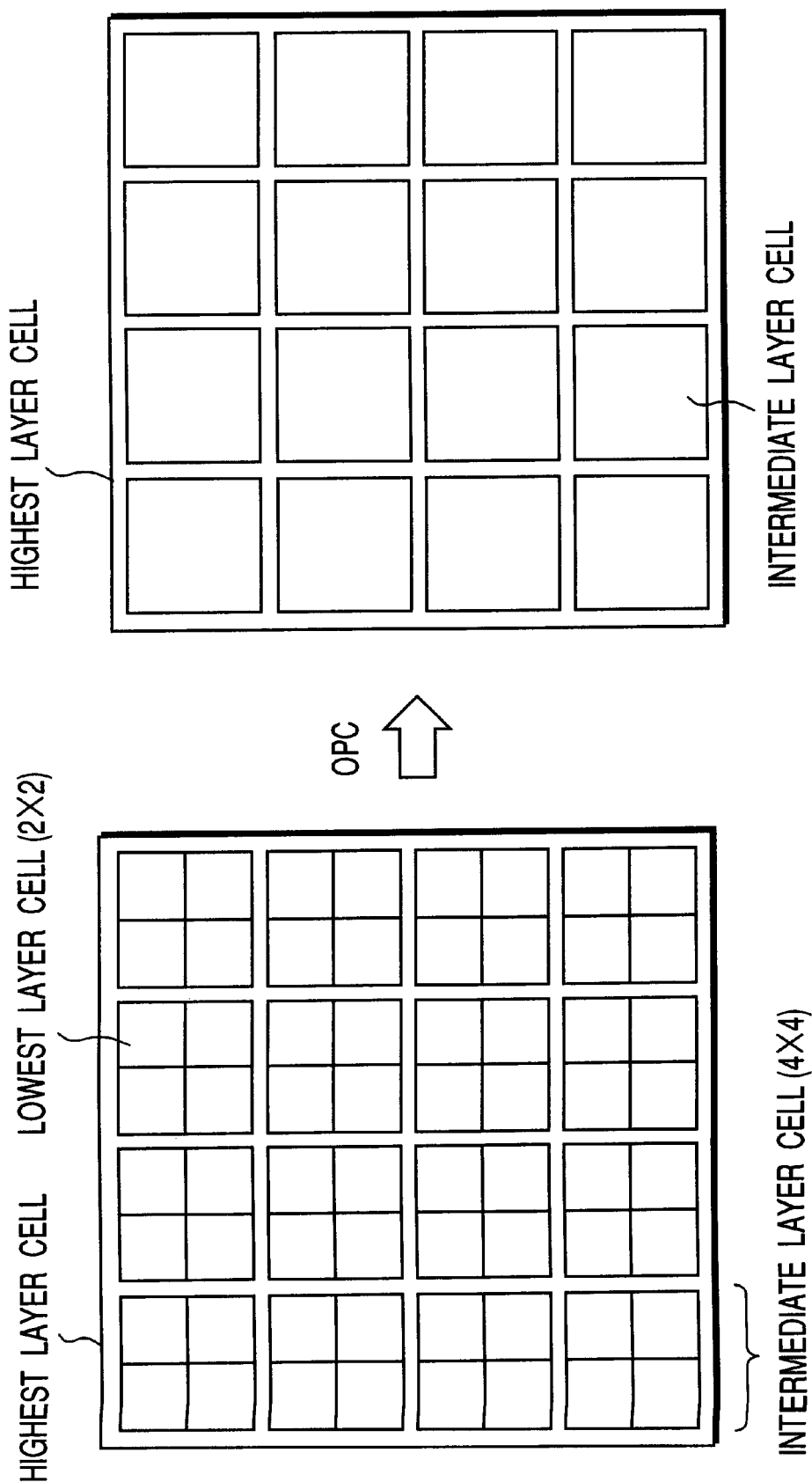
F I G. 2

MASK PATTERN PREPARING METHOD AND PHOTOMASK

BACKGROUND OF THE INVENTION

The present invention relates to a method for preparing a mask pattern and a photomask prepared by the method above.

With a recent advance toward a high integration of LSIs, a transfer pattern has been more and more miniaturized. That is, a recent tendency has been toward the use of short wavelength of a light source in an exposure apparatus, the use of a high numerical aperture in an optical projection system, the use of a high resolution resist, the use of a super resolution technique, etc. By the use of such techniques, a pattern which is very fine from an optical viewpoint in comparison with a conventional pattern, that is, a pattern which is low in a k1 value, can be transferred onto a wafer, noting that the k1 value denotes a value normalized by $\lambda/NA$ where $\lambda$: a light exposure wavelength and NA: the numerical aperture. In the case where such a low-k1 pattern is transferred onto the wafer, an optical proximity effect (OPE), that is, a displacement of a transfer pattern from a desired pattern caused by a pattern arrangement, etc., becomes prominent. In recent years, investigation has been conducted on the use of an optical proximity correction (OPC) as a technique for obtaining a transfer pattern, as desired, on the wafer by considering such optical proximity effect at a designing stage and initially correcting an associated mask.

One OPC method is by finding an optical image on a wafer by virtue of a photolithography computation and calculating an amount of displacement between a desired pattern and a transfer pattern on the basis of the optical image found. With respect to the optical proximity effect resulting from an optical system and resist process, it is only necessary to perform computation on an area in a radius range of below 1 to 2 $\mu$m. If, on the other hand, a finishing configuration, after etching, is made to have a desired configuration, calculation is required in a range of about a few $\mu$m to several tens of $\mu$m.

Design data as a correction target often takes a form such that the same pattern is repeatedly arranged. In this case, the data structure is divided into drawing information (apex coordinate information) and array information of the same pattern, so that it is possible to largely compress the data amount. In a memory device such as a DRAM, therefore, a data hierarchical structure is often deep.

FIG. 7 shows a practical model as a basic hierarchical structure where the same cells are arranged in a given array. In this practical structure, an intermediate layer cell is comprised of (2×2) lowest layer cells and a highest layer cell is comprised of such intermediate layer cells, that is, (4×4) intermediate layer cells. If, in order to set the finishing configuration, after etching, in a desired state, the optical proximity correction is done on such data while consideration is given up to the etching, a larger portion of such a layer structure of the design data is flattened.

If the optical proximity correction is made in a range of a few $\mu$m to a few tens of $\mu$m while consideration is given up to the etching, then a problem arises, such as it will be very difficult to prepare a mask because associated data is explosively grown.

BRIEF SUMMARY OF THE INVENTION

The present invention is achieved with the above-mentioned task in view and it is accordingly the object of the present invention to provide a method for preparing a mask pattern and a photomask which can suppress a data amount from being explosively grown and prepare a desired transfer pattern with high accuracy.

In one aspect of the present invention, there is provided a method for preparing a mask pattern used for forming a desired pattern on a substrate to be exposed, comprising the step of:

effecting correction on design data in connection with a first element to be corrected, the first element allowing a correction amount to be determined depending upon a pattern contained in an area of a predetermined size;

converting the corrected design data to mask writing data; and, when write processing is done with a writing device in which mask writing data is incorporated, effecting correction in connection with a second element to be corrected which excludes the first element.

It is preferable that the predetermined size (here, the term "size" denotes a size on the substrate to be exposed) be set to be greater than a size of an area over which, upon exposure, an optical effect exceeding a predetermined amount is exerted and be smaller than a size of a highest layer cell in a hierarchical structure included in the design data.

It is preferable that the writing device be comprised of an electron beam writing device and that the correction effected in connection with the second element be performed together with proximity correction of the electron beam writing.

According to the method, the correction is effected on the design data in connection with the first element, the first element allowing a correction amount to be determined depending upon a pattern (especially arrangement or disposition of a pattern) contained in an area of a predetermined size, that is, in a narrower area with a correcting site as a center and, when writing is done by the writing device in which mask writing data is incorporated, correction (correction on a wider area) is effected in connection with the second element to be corrected which excludes the first element.

It is, therefore, possible to suppress a data amount from be largely grown and to prepare a desired transfer pattern, with high accuracy, by transferring a pattern on a wafer with the use of the photomask having a mask pattern obtained by the above-mentioned method.

In another aspect of the present invention, there is provided a method for preparing a mask pattern used for forming a desired pattern on a substrate to be exposed, comprising the steps of:

effecting correction on design data in connection with a first element to be corrected, the first element allowing a correction amount to be determined depending upon a pattern contained in an area of a size corresponding to a size of any desired layer cell between a highest layer cell and a lowest layer cell in a hierarchical structure of the design data;

converting the corrected design data to mask writing data; and, when write processing is done with a writing device in which mask writing data is incorporated, effecting correction in connection with a second element to be corrected which excludes the first element.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a flow chart showing a method for preparing a mask pattern according to an embodiment of the present invention;

FIG. 2 is an explanative view showing, as a model, a hierarchical data structure according to an embodiment of the present invention;

DETAILED DESCRIPTION OF THE INVENTION

Figure 3:
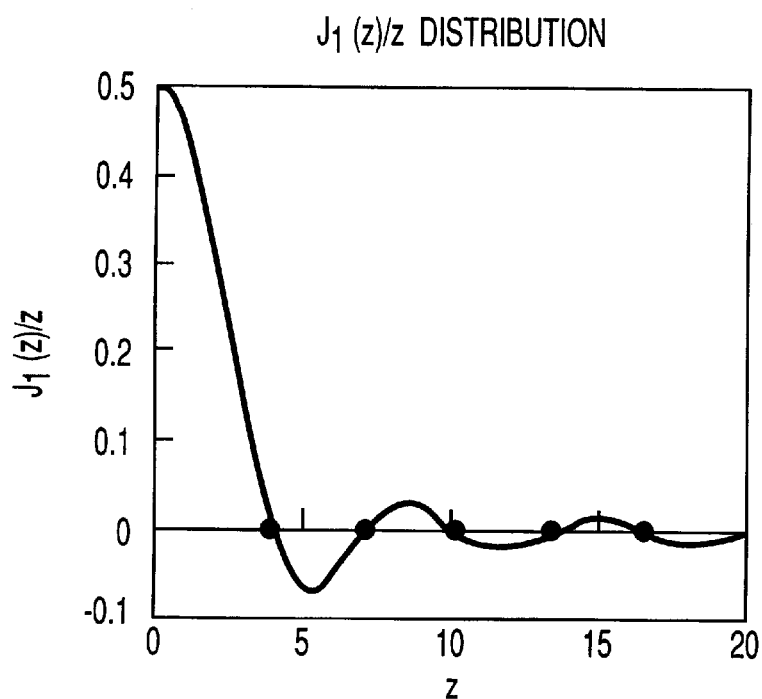
FIG. 3 is a view showing a range over which, upon exposure, an optical effect is exerted.

The embodiment of the prevent invention will be explained below with reference to the accompanying drawing.

First, an explanation will be given below about a principle on which the prediction of a finishing configuration is effected by simulation.

The finishing configuration is determined by an optical system, a pattern, developing condition, etching condition, etc. The finishing configuration U is represented by the following equation:

$$U: \forall (x,y),\ P(x,y)=\text{constant}$$

That is, the finishing configuration U is defined as (x,y) all satisfying the condition of $P(x,y)=\text{constant}$. In this case, the configuration function $P(x,y)$ for the simplest model (threshold model) is represented by a product of an image intensity distribution $I(x,y)$ formed on a wafer times an exposure amount.

Further, a configuration $P(x,y)$ after a resist development or after etching can be represented by the following equation as shown in John P. Stirniman "Spatial filter models to describe IC lithographic behavior" (SPIE Vol. 3051 pp. 469 (1997)).

$$P(x,y)=M*K_m(x,y)=I(x,y)*K(x,y)$$

That is, the configuration $P(x,y)$ after a resist development or after etching can be represented by a convolution of a mask pattern M or optical image (projection image) and a given function K. For the function K it is preferable to use a function having a property of $K(x) \approx 0$ at $|x|>W$ with W representing a given value.

Generally, a range over which an optical proximity effect works is finite and an influence of the proximity effect differs depending upon the degree of proximity of an adjacent pattern. Therefore, the above-mentioned function K can be represented by a sum of Gaussian distribution functions. The respective Gaussian distribution functions are represented, as follows, depending upon the relation of magnitudes of 3 $\sigma$ values ($\sigma$: a standard deviation) and predetermined size W.

$$K=K_1+K_2$$
$$K_1=\Sigma C_{1,j}K_{1,j}\ (3\sigma<W)$$
$$K_2=\Sigma C_{2,j}K_{2,j}\ (3\sigma\geq W)$$

$$K_{ni}(x,y) = \frac{1}{\sqrt{2\pi}\,\sigma_{ni}} \exp\left(-\frac{x^2+y^2}{2\sigma_{ni}^2}\right)$$

Here, the size W is preferably set to be greater than a size Wa of an area over which an optical influence exceeding a predetermined amount is exerted. In the case where, for example, an area of a size W is a circle of a radius L and an area of a size Wa is a circle of a radius La, it is preferable to set the circles to be L>La.

Let it be assumes that, for example, a very small light transmitting pattern for transferring a hole pattern on the wafer is formed on a mask. In this case, the amplitude distribution E(R) of an optical image formed on the wafer via a projection optical system is given by:

$$E(R)\ J_1(\pi \cdot NA \cdot R/\lambda)/(\pi \cdot NA \cdot R/\lambda)$$

where $J_1(R)$: a linear Bessel function;

NA: the numerical aperture of the projection optical system;

$\lambda$: the wavelength of a projection light; and

R: a radium of a pattern on a projection surface with a very small hole as a center.

The above-mentioned relation, being represented, is as shown in FIG. 3, noting that, in FIG. 3, $Z=\pi \cdot NA \cdot R/\lambda$.

From FIG. 3 it is evident that the amplitude becomes smaller than 0.02 if the distance is farther than a zero point (a third zero point) near to Z=10. Even if any amplitude interference is produced between those adjacent patterns, an influence is simply 0.02×2=0.04, that is, about 4% at max. Therefore it may be said that, if $R>(10\lambda/\pi NA)$, an optical influence upon exposure is very small. Further, even where the distance is farther than a zero point (a second zero point) near to Z=7, the amplitude is smaller than 0.032. Thus, even if $R>(7\lambda/\pi NA)$, it may be said that any optical influence upon exposure is, to some extent, small.

Seen from the above, the radius L of the area of a size W is preferably $L>(7\lambda/\pi NA)$ and more preferably $L>(10\lambda/\pi NA)$.

Further, for the design data having a hierarchical structure, the size W is preferably smaller than the size Wb of the cell in the highest layer of the hierarchical structure. Where, for example, the area of the size W constitutes a circle of a radius L and a highest layer cell constitutes a rectangle with the length of a shorter side given by Lb, it is preferred that L<Lb. In particular, it is preferable to select, as the size W, a size of an intermediate layer cell between the highest layer cell and a lowest layer cell.

FIG. 2 is a practical model as a basic layer structure having an array of identical cells. In this practical layer structure, an intermediate layer cell is constituted by (2×2) lowest layer cells and a highest layer cell is constituted by (4×4) intermediate layer cells.

In the practical layer structure shown in FIG. 2, the size W corresponds to the size of the intermediate layer cell. In the practical example shown in FIG. 2, a single intermediate layer structure is provided as the intermediate layer cell. If two or more intermediate layer cells are provided, the size W is made to correspond to a size of any desired one of these intermediate layer cells. By setting the size W as mentioned above and correcting the design data, the design data has the flattening of its hierarchical layer structure stopped at the intermediate layer structure without being flattened down to the lowest layer structure. It is, therefore, possible to prevent an associated data amount from growing explosively.

With reference to a flow chart as shown in FIG. 1, the method for preparing a mask pattern according to the present embodiment will be explained below on the basis of the above-mentioned matters.

First, correction is made on mask design data in accordance with a configuration prediction using $K_1$.

Mask design data (for example GDS-II) is prepared at step S1. Regarding a kernel 1 ($K_1$), correction processing is made on mask design data at step S2. By doing so, correction data is obtained at step S3. Stated in more detail, a projection image of a mask patter formed on a substrate to be exposed is found. Then a finishing configuration is found on the basis of the projection image. A correction amount is calculated on the basis of the difference between the finishing configuration and a desired design pattern configuration and correction is made on design data with the use of a calculated correction amount.

Then the thus corrected data is converted to an electron beam (EB) writing data at step S4. Even at this time, it is considered that the design data as a conversion target maintains a hierarchical layer structure to some extent. There is no large difference between an increase of data amount by this conversion and that of ordinary design data by a conversion.

Then the EB writing data is introduced into an EB writing device at step 5. In the EB writing device it is necessary to correct a dimensional difference caused by an exposure variation resulting from a back scattering of the electron beam, principally a back scattering depending upon a pattern writing area. For this reason, countermeasures are taken, such as the technique of applying a multiple exposure to a negative/positive inverted pattern, the technique of previously finding back-scattered components by computation and correcting an illumination level at each shot, and so on. At step S6, a kernel 2 ($K_2$) component is built, as a parameter, in a program for implementing optical proximity correction. For example, when EB writing data introduced into the writing device is expanded and exposure is made, a parameter of a $K_2$ component is incorporated into a program for performing the optical proximity correction. That is, in the write processing, the correction processing, together with the EB proximity correction processing, is performed in a manner to incorporate an effect of the $K_2$ component therein.

In this way, instead of performing write processing after preparing all write data with the $K_2$ component incorporated therein, the write processing is carried out such that correction processing is sequentially done with respect to the $K_2$ component. And the write processing is sequentially performed with the use of the correction-processed write data.

It is, therefore, possible to, without explosively growing a data amount, perform optical proximity correction with the finishing configuration, after etching, being incorporated therein.

Now, further explanation will be given below about the technique for incorporating the $K_2$ component into the EB proximity correction program.

In connection with an illumination amount correction method, for example, JPN PAT APPLN KOKAI PUBLICATION NO. 10-10701 describes the following technique. First, the technique comprises finding a relation between the rate of writing and the dimensional variation of a mask pattern, finding a relation between the illumination correction amount and the rate of writing with which the dimensional variation is corrected and performing illumination amount control in accordance with the found relation. That is, in order to obtain a desired finishing configuration, the technique comprises correcting an exposure amount distribution by giving consideration to a pattern density dependence of a conversion difference between the dimension of an exposure pattern given by an EB exposure to a resist and the dimension of a resist pattern formed through a developing step and a conversion difference between the dimension of the exposure pattern given by the EB exposure to the resist and the dimension of a light shielding pattern obtained through an etching process.

An ordinary EB proximity correction comprises correcting an exposure amount variation, by a back scattering, corresponding to the density of a pattern. In contrast, the technique of the KOKAI comprises, in order to convert a finishing configuration of a pattern which is obtained by a writing step to a desired configuration, correcting an exposure amount by giving consideration to those conversion differences produced by a light exposure, development and etching.

According to the present embodiment, in the technique described in the above-mentioned KOKAI for instance, the $K_2$ component is incorporated into a step of finding a relation between the rate of writing and the illumination correction amount. The difference between the finishing configuration, after exposure and etching, obtained with the use of a mask pattern corrected with the $K_1$ component alone is thought of as an influence caused by the $K_2$ component. It is, therefore, possible to obtain a desired mask pattern configuration by initially finding a correction illumination amount for correcting this difference (for example, initially preparing a conversion table showing a relation of an illumination correction amount to the rate of writing) and combining it with an inherent proximity correction.

Figure 4:
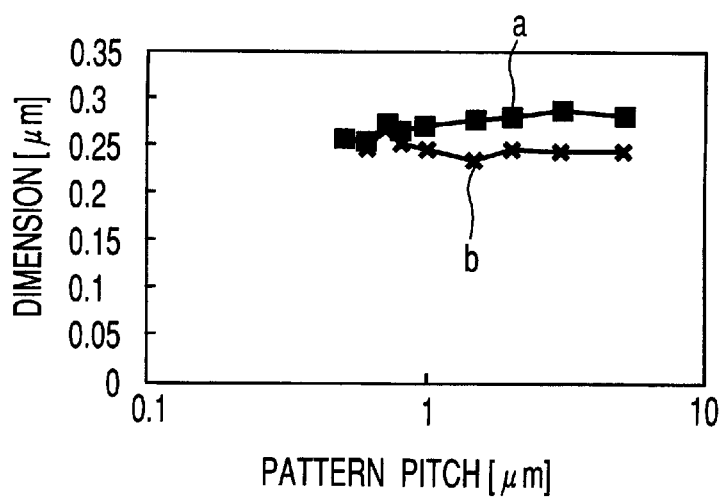
FIG. 4 is a view showing, for comparison, a variation of an "after-etching" dimension obtained according to the method of the present invention and a variation of an "after-etching" dimension obtained by a conventional method.

FIG. 4 shows a result of correction calculation made in accordance with a method of the present invention. The calculation is carried out under the conditions:

exposure wavelength 248 nm, NA=0.5, σ=0.5 circular illumination

COG. 0.25 $\mu$m line, just focusing $\sigma_1$=92 nm, $\sigma_2$=1410 nm $C_1$=1.1, $C_2$=−0.1

A mask used for the calculation is corrected so as to obtain a finishing pattern as a desired pattern in the case where $\sigma_1$ alone is considered.

In the case where, as shown in FIG. 4, correction is made on the $K_1$ component alone (a), a dimension after etching varies due to a pattern pitch and is displaced out of a desired dimension. A result of calculation made using, as data, the displacement amount out of the desired dimension is shown as a result of calculation (b) made after etching according to the present embodiment. By using the correction method shown in connection with the present invention it is possible to suppress the CD variation amount.

Figure 5:
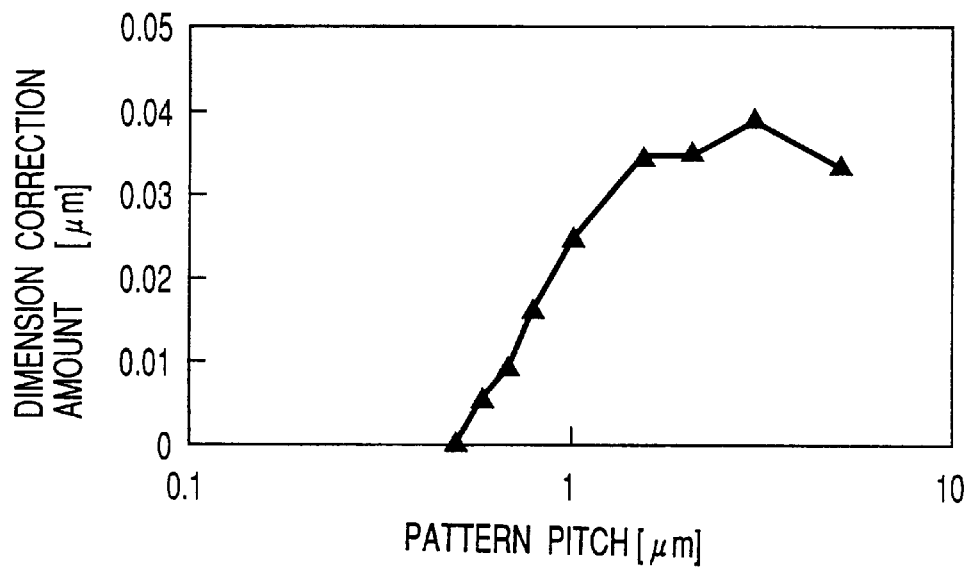
FIG. 5 is a view showing a dimension correction amount to be incorporated into an EB proximity correction when a mask as shown in FIG. 4 is prepared.
Figure 6:
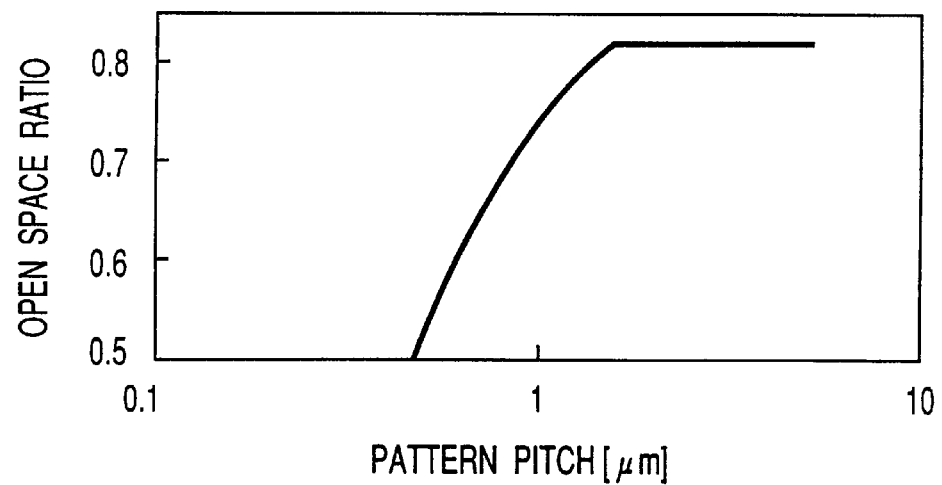
FIG. 6 is a view showing a dependence of a local pattern density with a pattern of interest as a center upon a pattern pitch.
Figure 7:
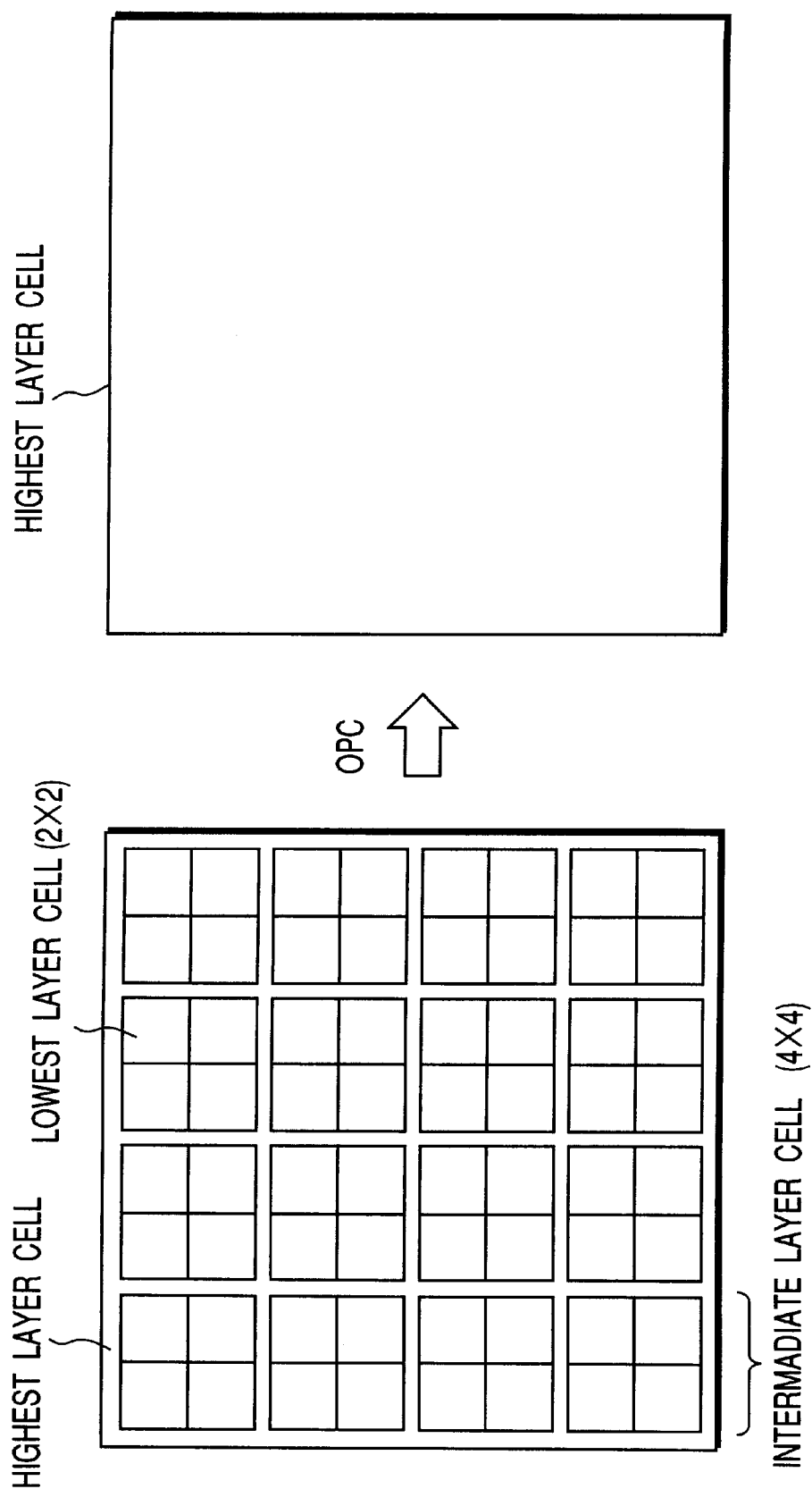
FIG. 7 is an explanative view showing, as a model, a hierarchical data structure according to the conventional technique.

FIG. 5 shows a dimension correction amount incorporated in the EB proximity correction in the preparation of a mask used in the case of FIG. 4. Here, a displacement amount of an "after etching" dimension out of the desired dimension is used directly as a mask correction amount. The dependence of this correction amount upon the pattern pitch has a better correlation to a tendency of an open-space ratio in a range of $\sigma_2$ (in FIG. 6) which is defined as a ratio of an area not covered with Cr on a reticule. It is, therefore, possible to obtain the above-mentioned result of correction by correcting the mask with the use of the values of FIG. 6 as a parameter.

Although, in the above-mentioned embodiment, the convolution kernel K is shown as a linear combination of a Gaussian distribution function, it is possible to use any proper function other than the Gaussian distribution function.

Further, although, in the above-mentioned embodiment, a correction algorithm is incorporated in the proximity correction at the time of the EB writing, a correction algorithm can be incorporated in a laser writing device for instance in place of the EB writing device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for preparing a mask pattern used for forming a desired pattern on a substrate to be exposed, comprising the steps of:

effecting correction on design data in connection with a first element to be corrected, the first element allowing a correction amount to be determined depending upon a pattern contained in a first area of a predetermined size;

converting the corrected design data to mask writing data; and, when write processing is done with a writing device in which the mask writing data is incorporated, effecting correction for the mask writing data in connection with a second element to be corrected which excludes the first element, the second element allowing a correction amount to be determined depending upon a pattern contained in a second area that is greater in size than the first area.

2. A method according to claim 1, wherein the predetermined size is set to be greater than a size of an area over which, upon exposing, an optical effect exceeding a predetermined amount is exerted and is smaller than a size of a highest layer cell in a hierarchical structure included in the design data.

3. A method according to claim 1, wherein the writing device is comprised of an electron beam writing device, and the correction effected in connection with the second element is performed together with proximity correction of the electron beam writing.

4. A method for preparing a mask pattern used for forming a desired pattern on a substrate to be exposed, comprising the steps of:

effecting correction on design data in connection with a first element to be corrected, the first element allowing a correction amount to be determined depending upon a pattern contained in a first area of a size corresponding to a size of any desired layer cell between a highest layer cell and a lowest layer cell in a hierarchical structure of the design data;

converting the corrected design data to mask writing data; and, when write processing is done with a writing device in which the mask writing data is incorporated, effecting correction for the mask writing data in connection with a second element to be corrected which excludes the first element, the second element allowing a correction amount to be determined depending upon a pattern contained in a second area that is greater in size than the first area.

5. A photomask having a mask pattern prepared by a method according to claim 1.

6. A photomask having a mask pattern prepared by a method according to claim 4.

* * * * *